United States Patent [19]

Nishida et al.

[11] Patent Number: 4,532,468

[45] Date of Patent: Jul. 30, 1985

[54] TEMPERATURE-COMPENSATING VOLTAGE GENERATOR CIRCUIT

[75] Inventors: Haruki Nishida, Yokohama; Yasuhiro Yano, Inagi, both of Japan

[73] Assignee: Fujitsu Limited, Kawasaki, Japan

[21] Appl. No.: 525,463

[22] Filed: Aug. 22, 1983

[30] Foreign Application Priority Data

Aug. 27, 1982 [JP] Japan .................. 57-149476

[51] Int. Cl.$^3$ ............................................. H03H 1/00
[52] U.S. Cl. ................................................. 323/367
[58] Field of Search ............... 323/294, 365, 366, 367, 323/369, 907, 909; 324/105, 441, 442, 443, DIG. 1; 331/175, 176

[56] References Cited

U.S. PATENT DOCUMENTS

| 3,970,966 | 7/1976 | Keller et al. ................. 331/176 |
| 4,000,643 | 1/1977 | Pearson . |
| 4,352,053 | 9/1982 | Oguchi et al. ................. 323/220 |
| 4,419,620 | 12/1983 | Kurtz et al. ................. 323/367 |

FOREIGN PATENT DOCUMENTS 1603729 5/1971 France .
1376961 12/1974 United Kingdom .

Primary Examiner—Peter S. Wong
Assistant Examiner—Judson H. Jones
Attorney, Agent, or Firm—Staas & Halsey

[57] ABSTRACT

A temperature-compensating voltage generator circuit for compensating the temperature characteristics of an electric device whose electrical characteristics vary in accordance with a change of the ambient temperature and can be changed or controlled by a control voltage. The temperature-compensating voltage generator circuit includes: a temperature-sensing device for generating an electric signal whose voltage level varies in accordance with a temperature change, and a discriminating device for discriminating the electric signal by using a predetermined reference voltage for generating output signals in accordance with the voltage level of the electric signal. The temperature-compensating voltage generator circuit also includes a distributing and combining device for distributing each of the output signals of the discriminating device into a plurality of distribution signals in accordance with a voltage ratio which is determined for each output signal and for generating a plurality of combined output signals by combining distribution signals distributed from each of the output signals of the discriminating device; and a coupling device for coupling the plurality of combined output signals of the distributing and combining device after inverting at least one of the plurality of combined output signals, and an output signal of the coupling device being used as a temperature-compensating voltage.

10 Claims, 8 Drawing Figures

TEMPERATURE-COMPENSATING VOLTAGE GENERATOR CIRCUIT

BACKGROUND OF THE INVENTION (1.) Field of the Invention

The present invention relates to a temperature-compensating voltage generator circuit used in an electric device whose temperature characteristics can be controlled by a control voltage. The temperature-compensating voltage generator circuit according to the present invention is preferably used, for example, in an oscillation frequency stabilizing circuit of a high-stability feedback type dielectric oscillator used in the microwave frequency band.

(2.) Description of the Prior Art

The oscillation frequency of a feedback type of dielectric oscillator used in the microwave frequency band varies depending on the gate bias voltage as well as on the ambient temperature. Therefore, it is possible to compensate the temperature characteristic of the oscillation frequency by controlling the gate bias voltage. If the temperature characteristic is compensated by controlling the gate bias voltage, it is usually compensated by, at first, measuring the temperature characteristic of an electric circuit in which the temperature characteristic is to be compensated and then by selecting and adjusting a control voltage generating circuit in accordance with the temperature characteristic.

The above-mentioned method involves practically no problems when it is used for electric circuits having a constant-slope temperature characteristic because it is not necessary to adjust the compensating circuit for individual electric circuits. However, when the above-mentioned method is used for electric circuits each having a different temperature characteristic or a temperature characteristic not having a constant slope, the process of selecting and adjusting the above-mentioned control voltage generator becomes very complicated.

In order to solve the above-mentioned problem, in U.S. Pat. No. 4,352,053, which is assigned to the assignee of the present invention, a temperature-compensating voltage generator circuit wherein the control voltage at any temperature can be adjusted without exerting a great influence on the control voltage adjusted at other temperatures. However, in this temperature-compensating voltage generator circuit, it is impossible to adjust the control voltage at any temperature without exerting any influence on the control voltage at other temperatures.

SUMMARY OF THE INVENTION

It is an object of the present invention to provide a temperature-compensating voltage generator circuit in which the control voltages required at low and high temperatures can be freely and independently adjusted without the adjusted value being affected at a normal temperature in an adjusting stage of the control voltages corresponding to a required temperature characteristic.

It is another object of the present invention to provide a temperature-compensating voltage generator circuit in which it is possible to read the level of the control voltages required for temperature compensation when the temperature characteristic of a circuit which necessitates temperature compensation is measured.

According to the present invention, there is provided a temperature-compensating voltage generator circuit which comprises: temperature-sensing means for generating an electric signal whose voltage level varies in accordance with a temperature change; discriminating means for discriminating the electric signal generated by the temperature-sensing means by using a predetermined reference voltage and for generating output signals in accordance with the voltage level of the electric signal; a distributing and combining means for distributing each of the output signals of the discriminating means as a plurality of distribution signals in accordance with a voltage ratio which is determined for each output signal and for generating a plurality of combined output signals, each combined output signal being generated by combining distribution signals distributed from each of the output signals of the discriminating means; and coupling means for coupling the plurality of combined output signals of the distributing and combining means after inverting at least one of the plurality of combined output signals and, an output signal of the coupling means being used as a temperature-compensating voltage.

DESCRIPTION OF THE PREFERRED EMBODIMENTS

The embodiments of the present invention are described in detail with reference to the drawings.

Figure 1:
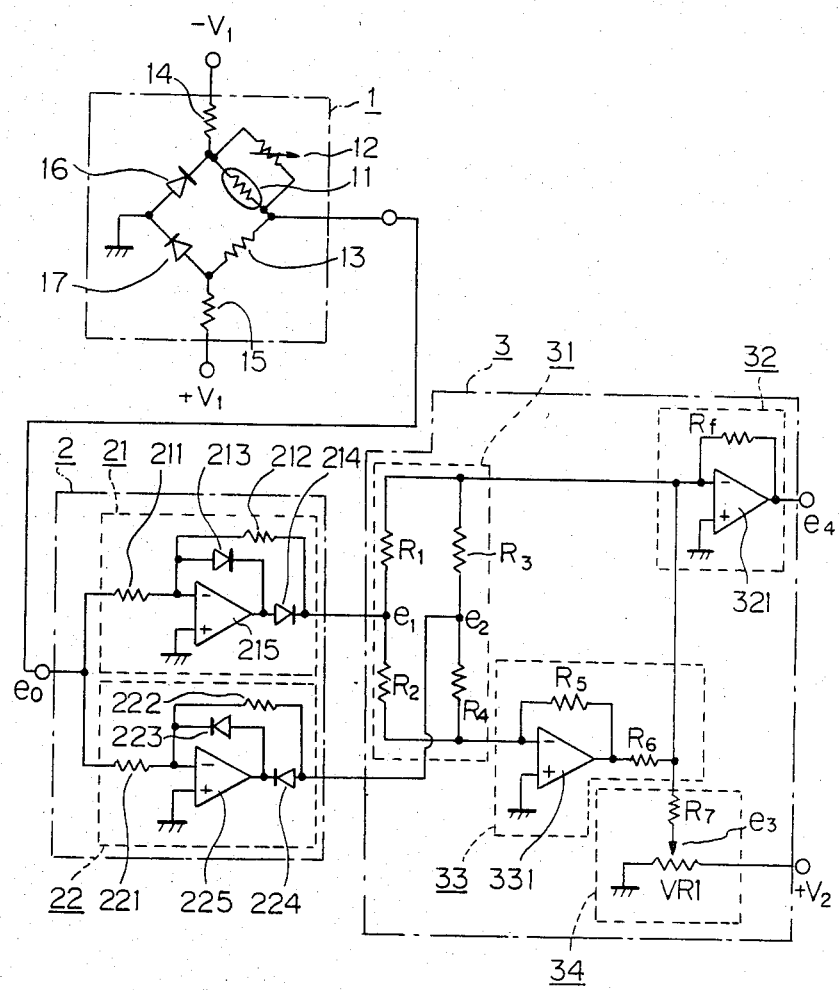
FIG. 1 is a circuit diagram of a temperature-compensating voltage generator circuit which is a first embodiment of the present invention.

FIG. 1 is a circuit diagram of a temperature-compensating voltage generator circuit according to the present invention.

In FIG. 1, reference numeral 1 designates a temperature sensor. The temperature sensor 1 comprises a temperature-sensitive resistor element 11, a variable resistor 12, resistors 13 through 15, and diodes 16 and 17.

Reference numeral 2 designates a diode circuit which is mainly divided into ideal diode circuit 21 whose output voltage varies when negative voltages are input thereto and ideal diode circuit 22 whose output voltage varies when positive voltages are input thereto. The ideal diode circuit 21 comprises resistors 211 and 212, diodes 213 and 214, and an operational amplifier 215, and the ideal diode circuit 22 comprises resistors 221 and 222, diodes 223 and 224, and an operational amplifier 225.

Reference numeral 3 designates a voltage control circuit. The voltage control circuit 3 comprises a resistor-dividing circuit 31, a first operational amplifier 32, a second operational amplifier 33, and a voltage setting circuit 34. The resistor-dividing circuit 31 comprises resistors $R_1$ through $R_4$, the first operational amplifier 32 comprises an operational amplifier unit 321 and a resistor $R_f$, the second operational amplifier 33 comprises an operational amplifier unit 331 and resistors $R_5$ and $R_6$, and the voltage-setting circuit 34 comprises a variable resistor $VR_1$ and a resistor $R_7$. The symbol $e_0$ represents the output voltage of the temperature sensor 1, the symbols $e_1$ and $e_2$ represent the output voltage of the ideal diode circuit 21 and the ideal diode circuit 22, respectively, the symbol $e_3$ represents the output voltage of the voltage-setting circuit 34, and the symbol $e_4$ represents the output voltage of the first operational amplifier 32, i.e., the control voltage generated by the circuit according to the present invention.

Figure 2A:
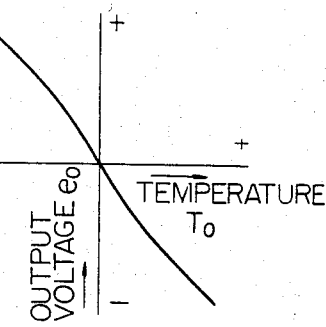
FIG. 2A is a graph illustrating an operating characteristic of a temperature sensor used in the circuit of FIG. 1.

In FIG. 1, the temperature sensor 1 is a conventional temperature-sensitive voltage generator which uses two power sources having a positive voltage and a negative voltage. That is, in the temperature sensor 1, a DC voltage $-V_1$ and a DC voltage $+V_1$ are applied to open ends of the resistors 14 and 15, respectively, and a combination of the temperature-sensitive resistor element 11 whose resistance value varies in accordance with a temperature change, the variable resistor 12, and the resistor 13 are coupled between the other ends of the resistors 14 and 15. As is shown in the graph of FIG. 2A illustrating the operating characteristic of the temperature sensor, the temperature sensor 1 has a negative voltage characteristic at temperatures higher than a normal temperature and has a positive voltage characteristic at temperatures lower than a normal temperature, if the output voltage $e_0$ of the temperature sensor 1 is adjusted to 0 V as a reference voltage at a normal temperature.

Figure 2B:
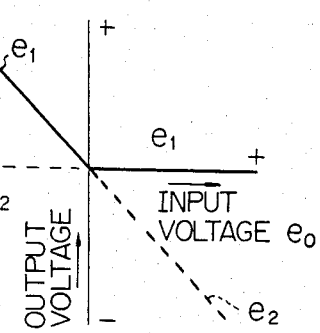
FIG. 2B is a graph illustrating the operating characteristics of ideal diode circuits used in the circuit of FIG. 1.

FIG. 2B illustrates the operating characteristics of the diode circuit 2. In FIG. 2B, the solid lines show the operational characteristic of the ideal diode circuit 21 in which the output voltage $e_1$ becomes a voltage between 0 V and some positive voltage when a negative voltage is input thereinto and becomes 0 V when a positive voltage is input thereto. The broken lines in FIG. 2B show an operating characteristic of the ideal diode circuit 22 in which the output voltage $e_2$ becomes a voltage between 0 V and some negative voltage when a positive voltage is input thereinto and becomes 0 V when a negative voltage is input thereinto. The ideal diode circuit 22, like the ideal diode circuit 21, is a known type ideal diode circuit.

In the embodiment of FIG. 1, the first operational amplifier 32 is an inverting input amplifier, and the second operational amplifier 33 is a polarity-inverting circuit. In the voltage-setting circuit 34, the variable resistor $VR_1$, to which a positive DC voltage $+V_2$ is applied at an open terminal thereof, divides the voltage $+V_2$.

In the embodiment of FIG. 1, the output voltage $e_0$ of the temperature sensor 1 is distributed and input into the ideal diode circuits 21 and 22. The output voltage $e_1$ of the ideal diode circuit 21 is distributed and input into the inverting input terminals of the first operational amplifier 32 and the second operational amplifier 33 via the resistors $R_1$ and $R_2$, respectively. The output voltage $e_2$ of the ideal diode circuit 22 is distributed and input into the inverting input terminals of the first operational amplifier 32 and the second operational amplifier 33 via the resistors $R_3$ and $R_4$. The output voltage of the second operational amplifier 33 and the output voltage $e_3$ of the voltage-setting circuit 34 which is used for offsetting the output voltage $e_4$ of the first operational amplifier 32 are input into the inverting input terminal of the first operational amplifier 32 via the resistors $R_6$ and $R_7$, respectively.

Figure 2C:
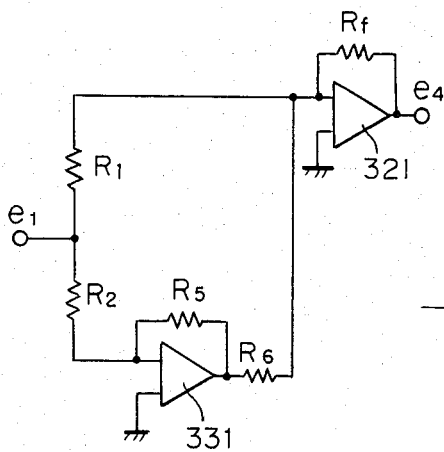
FIG. 2C is a partial circuit diagram of a voltage-control circuit used in the circuit of FIG. 1.

FIG. 2C, which is a partial circuit diagram of a voltage control circuit, shows, for the sake of simplicity, a circuit relating only to the operation of the output voltage $e_1$ of the ideal diode circuit 21. The output voltage $e_4$ of the first operational amplifier 32 is based on the general theory of operational amplifiers with reference to FIG. 2C and is as follows:

$$e_4 = \left( \frac{R_5}{R_2} \cdot \frac{R_f}{R_6} - \frac{R_f}{R_1} \right) e_1 = \left( \frac{R_5}{R_2 R_6} - \frac{1}{R_1} \right) R_f e_1 \quad (1)$$

Figure 2D:
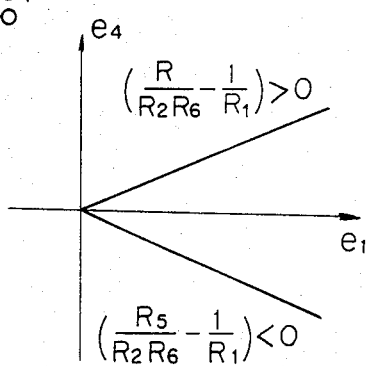
FIG. 2D is a graph illustrating an operating characteristic of the circuit illustrated in FIG. 2C.

The equation (1) shows that the value $e_4$ changes in direct or inverse proportion to the value $e_1$ in accordance with the selection of $R_1$ and $R_2$. FIG. 2D shows the relationship between $e_1$ and $e_4$ of the equation (1).

Therefore, the output voltage $e_4$ of the voltage control circuit of FIG. 1 becomes as follows:

$$e_4 = \left( \frac{R_5}{R_2 R_6} - \frac{1}{R_1} \right) R_f e_1 + \left( \frac{R_5}{R_4 R_6} - \frac{1}{R_3} \right) R_f e_2 - \frac{R_f}{R_7} e_3 \quad (2)$$

$$= K_1 e_1 + K_2 e_2 + K_3 e_3$$

where, $$K_1 = \left( \frac{R_5}{R_2 R_6} - \frac{1}{R_1} \right) R_f, \; K_2 = \left( \frac{R_5}{R_4 R_6} - \frac{1}{R_3} \right) R_f, \quad (3)$$

$$K_3 = \frac{R_f}{R_7}$$

As is shown in FIG. 2A, if the temperature is higher than the reference temperature (i.e., the normal temperature), the voltage $e_0$ is less than zero and thus the voltage $e_1$ is larger than zero and the voltage $e_2$ is zero. Therefore equation (2) is as follows:

$$e_4 = K_1 e_1 + K_3 e_3 \quad (4)$$

The value of $K_1$ in equation (3) can be changed to a positive value, a negative value or 0 by selecting the values of $R_1$ and $R_2$. That is, the control voltage at a high temperature range can be adjusted, including a change of polarity, by changing $R_1$ and $R_2$.

Similarly, if the temperature is lower than or equal to the reference temperature, the voltage $e_0$ is larger than zero and thus the voltage $e_1$ is equal to zero and the voltage $e_2$ is smaller than zero. Therefore, equation (2) is as follows:

$$e_4 = K_2 e_2 + K_3 e_3 \quad (5)$$

From equation (5), the control voltage $e_4$ can be adjusted by changing the value $K_2$ of the equation (3), including a change of polarity, by changing $R_3$ and $R_4$.

The third term of equation (2) is not dependent on the temperature, and, therefore, it is possible to adjust the control voltage $e_4$ to a desired value by adjusting the variable resistor $VR_1$ at a reference temperature in which $e_0=0$ and $e_1=e_2=0$.

Figure 3:
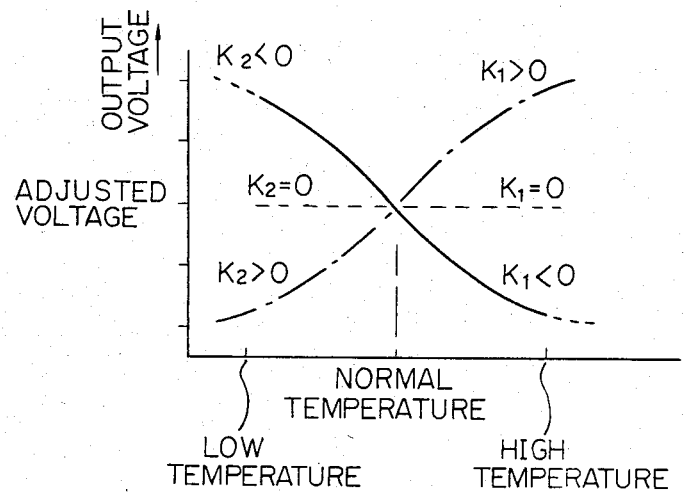
FIG. 3 is a graph illustrating a variable range of a control voltage in the circuit of FIG. 1.

As is apparent from the above description, it is possible to independently adjust the control voltages at the reference temperature, a high temperature, and a low temperature in the circuit of FIG. 1. FIG. 3 shows the variable range of the control voltage $e_4$ of equation (2) with regard to the temperature. The characteristic curves of FIG. 3 are second-order slope curves because the temperature characteristic of the temperture-sensitive resistor element 11 is not linear. It should be noted that the characteristic curves of FIG. 3 can be adjusted to any form by selecting a particular element and by adjusting the variable resistor 12.

It is possible to replace part of the resistance provided by resistors $R_1$ and $R_2$ and part of the resistance provided by resistors $R_3$ and $R_4$ with variable resistors, thereby simplifying the adjustment thereof. It is also possible to adjust the reference voltage of the temperature sensor to 0 V at a temperature other than the normal temperature.

Figure 4:
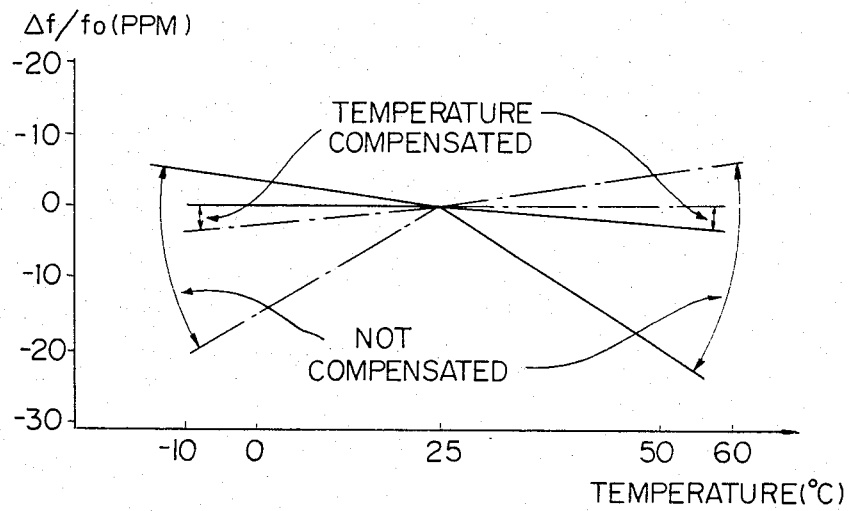
FIG. 4 is a graph illustrating an example of the temperature characteristics of a microwave oscillation frequency compensated by using a temperature-compensating circuit according to the present invention.

FIG. 4 illustrates an example of an oscillation frequency characteristic of a high-stability feedback type dielectric oscillator which is used in the microwave band and which has substantially the same circuit construction as that of the oscillator circuit disclosed in FIG. 26 of U.S. Pat. No. 4,352,053 except that the control voltage generator circuit thereof is replaced with the temperature-compensating voltage generator circuit according to the present invention. As is shown in FIG. 4, the spread of the temperature-slope characteristics of a dielectric oscillator, which is not equipped with a temperature-compensating voltage generator circuit, is narrowed to a range of about 11% through 16% in the oscillator which is equipped with the temperature-compensating voltage generator circuit according to the present invention. It should be noted that in the temperature-compensating voltage generator circuit according to the present invention, unlike in the control voltage generator circuit disclosed in the above-mentioned U.S. Pat. No. 4,352,053, it is possible to independdently adjust the control voltage at any temperature without effecting the control voltage at another temperature.

Figure 5:
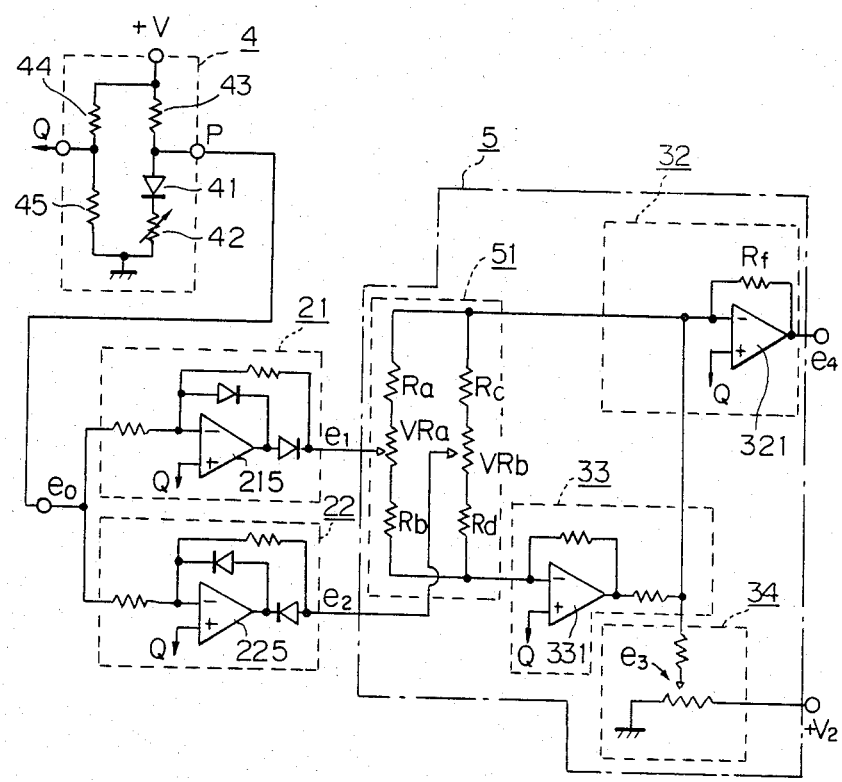
FIG. 5 is a circuit diagram of a temperature-compensating voltage generator circuit which is another embodiment of the present invention.

FIG. 5 illustrates a temperature-compensating voltage generator circuit which has a positive voltage characteristic and which is another embodiment of the present invention. In FIG. 5, the portions corresponding to those of FIG. 1 are designated by the same reference symbols and an explanation thereof is omitted for brevity.

In FIG. 5, reference numeral 4 designates a temperature sensor. The temperature sensor 4 comprises a silicon diode 41, a variable resistor 42, and resistors 43 through 45. The output terminal of the temperature sensor 4 is designated by P, and the output terminal of the reference voltage is designated by Q. Reference numeral 5 designates a voltage control circuit. A resistor voltage-dividing circuit 51 is composed of resistors $R_a$ through $R_d$ and variable resistors $VR_a$ and $VR_b$.

The circuit of FIG. 5 differs from that of FIG. 1 in that in the circuit of FIG. 5 the power source for the temperature sensor 4 is composed of one power source having a positive voltage $+V$, and the circuit of the temperature sensor 4 simply comprises resistors and a silicon diode. In the temperature sensor 4, it is possible to obtain an output voltage $e_0$ from the output terminal P, which voltage varies positively or negatively with regard to the reference voltage output from the reference-voltage output terminal Q in accordance with a temperature change, by using the temperature characteristic of the silicon diode 41 and by adjusting the values of the variable resistor 42 included in a bridge circuit.

Therefore, the aforementioned output terminal Q of the reference voltage is connected to each of the non-inverting input terminals of the operational amplifiers 215 and 225 of the corresponding ideal diode circuits 21 and 22, the operational amplifier 321 of the first operational amplifier circuit 32, and the operational amplifier 331 of the second operational amplifier circuit 33. In order to simplify the adjustment of the control voltage, the variable resistors $VR_a$ and $VR_b$ are provided in the resistor voltage-dividing circuit 51.

In FIG. 5, one power source having a positive voltage is used as the power source of the temperature sensor. However, it should be noted that the power source of the temperature sensor can be easily replaced with a power source having a negative voltage.

As was mentioned above in detail, according to the temperature-compensating circuit of the present invention, it is possible to directly compensate the temperature characteristic of an electric circuit which necessitates such compensation when the temperature characteristics thereof are measured. It is possible to independently compensate the temperature characteristic at a low temperature and at a high temperature by checking the temperature characteristic at a low temperature and a high temperature only once. In this case, the temperature compensation at a low temperature and at a high temperature does not affect the control voltage previously adjusted at a normal temperature. According to the present invention, the complex process of compensating the temperature characteristic of a conventional voltage-controlled electric circuit is simplified, and, moreover, it is possible to freely compensate the temperature characteristic even if the temperature slopes of the electric circuit are distributed in a complex manner.

We claim:

1. A temperature-compensating voltage generator circuit, comprising:
   temperature-sensing means for generating an electric signal whose voltage level varies in accordance with a temperature change;
   discriminating means, operatively connected to said temperature-sensing means, for discriminating said electric signal generated by said temperature-sensing means by using a predetermined reference voltage and for generating output signals in accordance with the voltage level of said electric signal;
   distributing and combining means, operatively connected to said discriminating means, for distributing each of said output signals of said discriminating means into a plurality of distribution signals in accordance with a voltage ratio which is determined for each output signal and for generating a plurality of combined output signals, each output signal being generated by combining distribution signals distributed from each of said output signals of said discriminating means; and
   coupling means, operatively connected to said distributing and combining means, for coupling said plurality of combined output signals of said distributing and combining means after inverting at least one of said plurality of combined output signals, and an output signal of said coupling means being used as a temperature-compensating voltage.

2. A temperature-compensating voltage generator circuit according to claim 1, wherein said discriminating means comprises a plurality of ideal diode circuits each operatively connected between said temperature-sensing means and said distributing and combining means and each receiving said electric signal generated by said temperature-sensing means.

3. A temperature-compensating voltage generator circuit according to claim 2, wherein said discriminating means comprises:
  a first ideal diode circuit, operatively connected between said temperature-sensing means and said distributing and combining means, which outputs one of the output signals when the potential of said electric signal generated by said temperature-sensing means is lower than said predetermined reference voltage; and
  a second ideal diode circuit, operatively connected between said temperature-sensing means and said distributing and combining means, which outputs one of the output signals when the potential of said electric signal generated by said temperature-sensing means is higher than said predetermined reference voltage.

4. A temperature-compensating voltage generator circuit according to claim 1, wherein said discriminating means includes output terminals and said coupling means includes input terminals, and said distributing and combining means comprises a plurality of sets of resistors, first ends of said resistors in each set being connected to one of the output terminals of said discriminating means and second ends of said resistors which belong to different sets and whose first ends are connected to different output terminals of said discriminating means being commonly connected to corresponding input terminals of said coupling means, thereby generating a plurality of combined output signals.

5. A temperature-compensating voltage generator circuit according to claim 1, wherein said coupling means comprises:
  at least one inverting circuit, operatively connected to said distributing and combining means, for inverting at least one of said combined output signals generated by said distributing and combining means and producing an output signal; and
  a mixing circuit, operatively connected to said inverting circuit and said distributing and combining means, for coupling the output signal of said inverting circuit and some of said combined output signals.

6. A temperature-compensating voltage generator circuit according to claim 5, wherein said inverting circuit comprises:
  an operational amplifier operatively connected to said distributing and combining means and said mixing circuit; and
  a feedback resistor operatively connected to said operational amplifier.

7. A temperature-compensating voltage generator circuit according to claim 5, wherein said mixing circuit comprises:
  an operational amplifier operatively connected to said inverting circuit and said distributing and combining means, and producing an output voltage; and
  a voltage-setting circuit, operatively connected to said operational amplifier and said inverting circuit, for offsetting the output voltage of said operational amplifier.

8. A temperature-compensating voltage generator circuit, comprising:
  a temperature sensor;
  a discriminating circuit operatively connected to said temperature sensor;
  a voltage dividing circuit operatively connected to said discriminating circuit;
  a first operational amplifier circuit operatively connected to said voltage dividing circuit;
  a second operational amplifier circuit operatively connected to said voltage dividing circuit and providing a control voltage; and
  a voltage setting circuit operatively connected to said second operational amplifier circuit.

9. A temperature-compensating voltage generator circuit according to claim 8, wherein said discriminating circuit comprises first and second ideal diode circuits operatively connected between said temperature sensor and said voltage dividing circuit.

10. A temperature-compensating voltage generator circuit according to claim 9, wherein said voltage dividing circuit comprises:
  a first resistor operatively connected between said first ideal diode circuit and said second operational amplifier circuit;
  a second resistor operatively connected between said first ideal diode circuit and said first operational amplifier circuit;
  a third resistor operatively connected between said second ideal diode circuit and said second operational amplifier circuit; and
  a fourth resistor operatively connected between said second ideal diode circuit and said first operational amplifier circuit.

* * * * *